(12) United States Patent
Utsumi et al.

(10) Patent No.: US 9,761,453 B2
(45) Date of Patent: Sep. 12, 2017

(54) METHOD FOR MANUFACTURING A SILICON CARBIDE SEMICONDUCTOR ELEMENT

(71) Applicant: FUJI ELECTRIC CO., LTD., Kawasaki-shi (JP)

(72) Inventors: Makoto Utsumi, Tsukuba (JP); Yoshiyuki Sakai, Tsukuba (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/848,983

(22) Filed: Sep. 9, 2015

(65) Prior Publication Data

US 2015/0380248 A1    Dec. 31, 2015

Related U.S. Application Data

(63) Continuation of application No. PCT/JP2014/065997, filed on Jun. 17, 2014.

(30) Foreign Application Priority Data

Jun. 21, 2013 (JP) ................................. 2013-131086

(51) Int. Cl.
*H01L 21/04* (2006.01)
*H01L 29/12* (2006.01)
(Continued)

(52) U.S. Cl.
CPC .... *H01L 21/0465* (2013.01); *H01L 21/31116* (2013.01); *H01L 22/12* (2013.01);
(Continued)

(58) Field of Classification Search
CPC .......... H01L 21/0465; H01L 21/31116; H01L 22/12; H01L 22/26; H01L 29/12;
(Continued)

(56) References Cited

U.S. PATENT DOCUMENTS 5,702,562 A    12/1997  Wakahara
6,287,929 B1 *  9/2001  Kato ................... H01L 29/0821
                                            257/E21.371
(Continued)

FOREIGN PATENT DOCUMENTS

EP            731387 A2     9/1996
JP        S61-270862 A    12/1986
(Continued)

*Primary Examiner* — Thanh T Nguyen
(74) *Attorney, Agent, or Firm* — Rabin & Berdo, P.C.

(57) ABSTRACT

An ion implantation mask, which is an inorganic insulating film, is formed on a silicon carbide substrate. A mask portion and two regions of an opened ion implantation portion are formed in the ion implantation mask by dry etching. At that time, a residual portion which is thinner than the mask portion is formed in the bottom of the opened ion implantation portion. Then, ions are implanted through the ion implantation mask to form a predetermined semiconductor region in the silicon carbide substrate. According to this structure, it is possible to prevent an increase in the roughness of the surface of the silicon carbide substrate and to improve breakdown voltage.

2 Claims, 6 Drawing Sheets (51) Int. Cl.
 *H01L 21/311* (2006.01)
 *H01L 29/16* (2006.01)
 *H01L 21/66* (2006.01)

(52) U.S. Cl.
 CPC .............. *H01L 22/26* (2013.01); *H01L 29/12* (2013.01); *H01L 29/1608* (2013.01)

(58) Field of Classification Search
 CPC .............. H01L 29/1608; H01L 21/0445; H01L 21/046; H01L 21/047
 See application file for complete search history.

(56) References Cited

U.S. PATENT DOCUMENTS

| | | | |
|---|---|---|---|
| 7,419,892 B2 | 9/2008 | Sheppard et al. | |
| 2005/0158986 A1* | 7/2005 | Wu | H01L 21/31105 438/634 |
| 2010/0163888 A1* | 7/2010 | Saggio | H01L 29/0619 257/76 |
| 2013/0045593 A1 | 2/2013 | Ooi | |
| 2014/0225215 A1* | 8/2014 | Chien | H01L 24/05 257/447 |
| 2015/0087104 A1* | 3/2015 | Tseng | H01L 27/1464 438/70 |

FOREIGN PATENT DOCUMENTS

| | | |
|---|---|---|
| JP | H02-79424 A | 3/1990 |
| JP | H08-250446 A | 9/1996 |
| JP | H08-298259 A | 11/1996 |
| JP | 2003-282853 A | 10/2003 |
| JP | 2007-189213 A | 7/2007 |
| JP | 2011-059547 A | 3/2011 |
| JP | 2012-160544 A | 8/2012 |
| JP | 5014734 B2 | 8/2012 |
| WO | WO 2013-027502 A1 | 2/2013 |

* cited by examiner

METHOD FOR MANUFACTURING A SILICON CARBIDE SEMICONDUCTOR ELEMENT

CROSS-REFERENCE TO RELATED APPLICATION(S)

This non-provisional application for a U.S. Patent is a Continuation of International Application PCT/JP2014/065997 filed Jun. 17, 2014, which claims priority from JP PA 2013-131086 filed Jun. 21, 2013, the entire contents of both of which are hereby incorporated by reference.

BACKGROUND OF THE INVENTION

1. Field of the Invention

The present invention relates to a method for manufacturing a silicon carbide semiconductor element using silicon carbide as a semiconductor material, and more particularly, to a silicon carbide semiconductor element in which a current flows from a front surface to a rear surface of a semiconductor substrate.

2. Background of the Related Art

Single-crystal silicon carbide (SiC) has a band gap or breakdown field strength that is significantly more than that of single-crystal silicon (Si). On-resistance which is resistance in an on state is inversely proportional to the cube of the breakdown field strength. Therefore, for example, in a silicon carbide semiconductor (four-layer periodic hexagonal: 4H—SiC) which has been widely used and is called a 4H type, it is possible to suppress the on-resistance to a few hundredths of the on-resistance of a silicon semiconductor.

Therefore, the silicon carbide semiconductor has the characteristics of a high radiation performance and high thermal conductivity and is expected as a next-generation low-loss power semiconductor element. For example, the silicon carbide semiconductor has been used to develop silicon carbide semiconductor elements with various structures, such as a Schottky barrier diode, MOSFET (insulated gate field effect transistor), a PN diode, an insulated gate bipolar transistor (IGBT), and a gate turn-off thyristor (GTO).

In the manufacture of the MOSFET using silicon carbide, it is necessary to form p and n regions using ion implantation since the diffusion coefficient of impurities in the silicon carbide is small. The p and n regions are formed through an ion implantation mask. A $SiO_2$ film is generally used as the ion implantation mask since ion implantation is generally performed at a temperature of 300° C. or more. Dry etching which enables anisotropic etching is used to form an opening portion with a width of submicrons to a few microns in the $SiO_2$ film. However, the surface of the silicon carbide semiconductor is physically or electrically damaged due to plasma or active species generated during etching, which causes breakdown when a high voltage is applied.

In order to suppress the damage caused during etching, a technique has been proposed in which positive and negative photoresists are used for an ion implantation mask, for example, see Japanese Patent No. 5014734 (Patent Document 1).

However, the technique using photoresist for the ion implantation mask has the following issues 1 to 3.

1. It is necessary to harden the resist at a high temperature. In this case, since the resist is shrunk, it is difficult to control dimensions. In particular, the aperture ratio of an opening portion of the resist varies depending on a position. As a result, the shrinkage percentage of the resist varies depending on the position.

2. The shape of the resist is changed during ion implantation due to an increase in temperature or exposure to plasma during ion implantation. As a result, the planar shape of an ion implantation region is changed or a forming position deviates from a desired position.

3. The resist closely adheres to the substrate due to a high temperature or exposure to plasma, which makes it difficult to remove the resist.

The invention has been made in view of the above-mentioned problems and an object of the invention is to provide a technique that prevents the damage of the surface of a silicon carbide semiconductor when an ion implantation mask is formed, easily form an opening portion of the ion implantation mask with high accuracy, and can improve a breakdown voltage.

SUMMARY OF THE INVENTION

In order to achieve the object, according to an aspect of the invention, there is provided a method for manufacturing a silicon carbide semiconductor element using a single-crystal silicon carbide substrate. The method includes: a step of forming an ion implantation mask, which is an inorganic insulating film, on the silicon carbide substrate; a step of forming a mask portion, an opened ion implantation portion, and a residual portion, which is provided in a bottom of the opened ion implantation portion and is thinner than the mask portion, in the ion implantation mask using dry etching; and a step of implanting ions through the ion implantation mask to form a predetermined semiconductor region in the silicon carbide substrate.

A residual portion which is thinner than the mask portion may be formed in a part of an opening portion of the ion implantation portion.

An etching rate required to form the ion implantation portion and the size of a residual film may be calculated. An etching time required to form the residual portion with a predetermined thickness may be calculated on the basis of a relationship between the calculated etching rate and the calculated size of the residual film. Etching may be performed for the calculated etching time.

A laminated film of the inorganic insulating films which are made of any one of a silicon oxide, a silicon oxynitride, and a silicon nitride may be formed as the ion implantation mask.

The ion implantation mask may have a thickness of 500 nm or more.

The residual portion may have a thickness of 100 nm or less.

According to the above-mentioned structure, dry etching is performed on the ion implantation mask formed on the silicon carbide substrate to form the residual portion, which has a predetermined thickness and is made of the same material as the mask portion, in the bottom of the opening of the ion implantation portion. Therefore, even when dry etching is performed, the surface of the silicon carbide substrate is not damaged and can be planarized. As a result, a reduction in the breakdown voltage is suppressed and the breakdown voltage can be improved.

According to the invention, it is possible to obtain a silicon carbide semiconductor element which can prevent the damage of the surface of the silicon carbide semiconductor when the ion implantation mask is formed, easily form the opening portion of the ion implantation mask with high accuracy, and improve the breakdown voltage.

DETAILED DESCRIPTION OF THE INVENTION

Hereinafter, preferred embodiments of a method for manufacturing a silicon carbide semiconductor element according to the invention will be described in detail with reference to the accompanying drawings. In the specification and the accompanying drawings, in the layers or regions having "n" or "p" appended thereto, an electron or a hole means a majority carrier. In addition, symbols "+" and "−" added to n or p mean that impurity concentration is higher and lower than that of the semiconductor region without the symbols. In the description of the following embodiments and the accompanying drawings, the same components are denoted by the same reference numerals and the description thereof will not be repeated.

Embodiment 1

Figure 1:
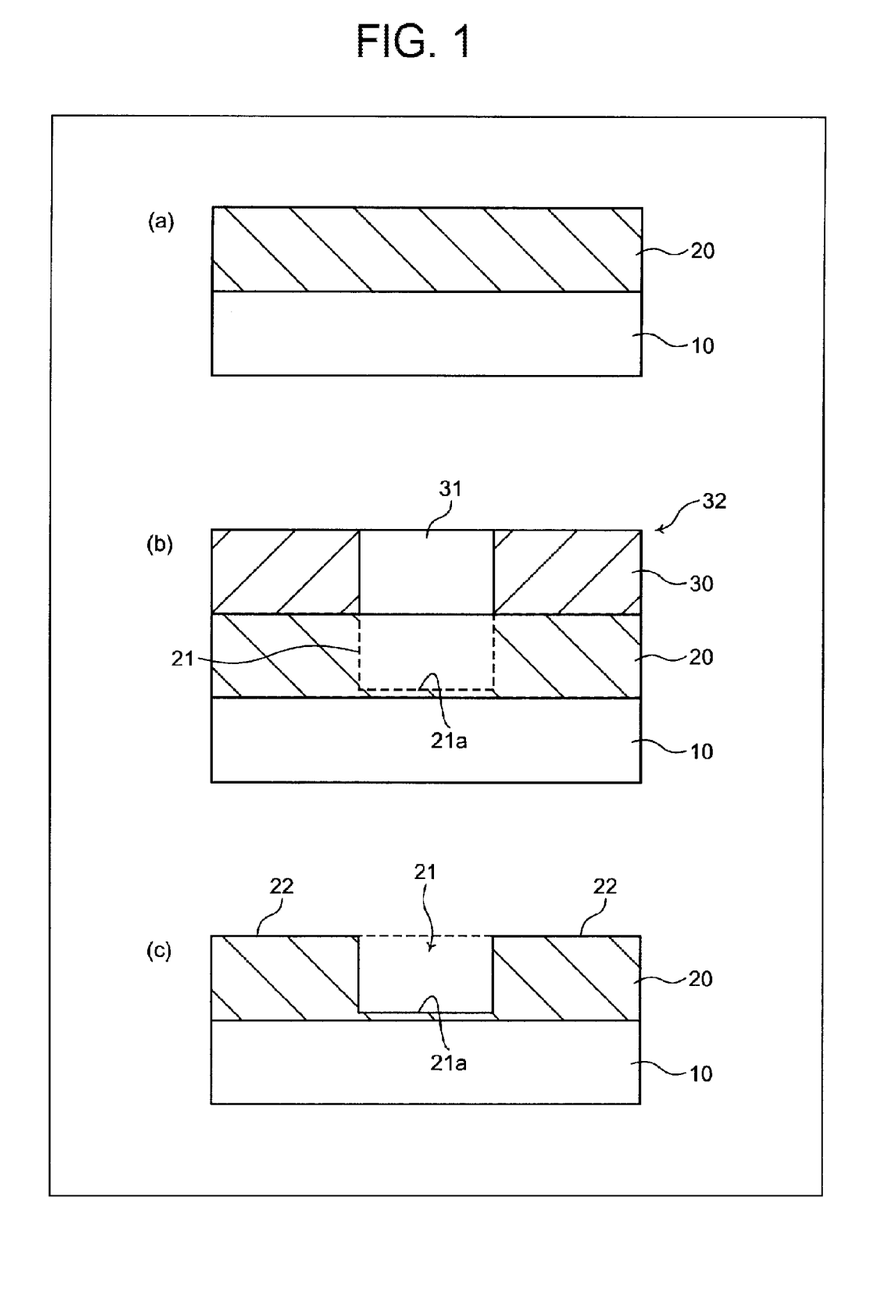
FIG. 1 is a cross-sectional view illustrating a process of manufacturing a silicon carbide semiconductor element according to Embodiment 1 of the invention.

A method for manufacturing a silicon carbide semiconductor element according to Embodiment 1 of the invention will be described. FIG. 1 is a cross-sectional view illustrating a process of manufacturing the silicon carbide semiconductor element according to Embodiment 1 of the invention.

First, as illustrated in FIG. 1(a), for example, an $n^-$ silicon carbide single-crystal substrate (hereinafter, referred to as an $n^-$ silicon carbide substrate) 10 which is made of four-layer periodic hexagonal silicon carbide (4H—SiC) and in which an $n^-$ silicon carbide epitaxial layer is formed on one main surface of an $n^+$ silicon carbide substrate is prepared.

Then, an inorganic insulating film 20 which functions as an ion implantation mask is deposited (formed) with a thickness of 1 μm on the main surface of the $n^-$ silicon carbide substrate 10. Then, as illustrated in FIG. 1(b), a photoresist 30 is applied onto the surface of the inorganic insulating film 20 and exposure and development are performed to pattern the photoresist, thereby forming a resist pattern 32 with an opening portion 31. For example, a SiOx film, a SiOxNy film, or a SiNx film can be used as the inorganic insulating film 20. For example, an atmospheric pressure CVD method, a low-pressure CVD method, or a plasma CVD method can be used as a method for forming the films.

Then, dry etching is performed using the resist pattern 32 as a mask. For example, a mixed gas of a fluorine-based gas, such as $CF_4$, $CHF_3$, or $SF_6$, and rare gas, such as Ar, is used as etching gas. The inorganic insulating film 20 which is disposed in the opening portion 31 of the resist pattern 32 is selectively removed by the dry etching and an opening portion 21 is formed.

Etching ends before the end point of the etching (a position where etching reaches the main surface of the $n^-$ silicon carbide substrate 10) is detected. Therefore, a portion with a predetermined thickness remains on the main surface of the $n^-$ silicon carbide substrate 10 in the opening portion 21 of the inorganic insulating film 20 disposed in the opening portion 31 of the resist pattern 32. In this way, a residual portion (residual film) 21a with a predetermined thickness is formed in the bottom of the opening portion 21. Then, the resist pattern 32 is removed by ashing.

As illustrated in FIG. 1(c), the ion implantation mask 20, which is the inorganic insulating film and includes the opening portion (ion implantation portion) 21 having the residual film 21a provided therein and the mask portion 22, is formed on the $n^-$ silicon carbide substrate 10 by the above-mentioned process.

In general, a single-layer film is used as the inorganic insulating film which is used as the ion implantation mask 20. However, a laminated film may be used as the inorganic insulating film. In this case, a difference between the etching rates enables an inorganic insulating film with a stable thickness to remain as the residual film 21a in the bottom of the opening portion 21. For example, a SiON film with a thickness of 100 nm is formed on the $n^-$ silicon carbide substrate 10 by a plasma CVD method using $SiH_4$, $N_2O$, and $NH_3$ gases. Then, a $SiO_2$ film with a thickness of 900 nm is formed using $SiH_4$ and $N_2O$ gases.

Then, the ion implantation mask 20 which is obtained by sequentially forming the SiON film and the $SiO_2$ film on the $n^-$ silicon carbide substrate 10 using $CF_4$ and Ar is etched. A difference in etching rate between SiON and $SiO_2$ is about 1.5. Therefore, when etching ends using a point where an emission intensity of about 310 nm indicating CO bonding starts to be reduced as an end point, a SiON film with a thickness of 50 nm to 100 nm can stably remain as the residual film 21a in the bottom of the opening portion 21.

Then, the $n^-$ silicon carbide substrate 10 having the ion implantation mask 20 formed thereon is introduced into an ion implantation apparatus and n-type impurity ions, such as phosphorus ions or nitrogen ions, are implanted. When the silicon carbide substrate 10 is a p type, p-type impurity ions, such as aluminum ions, are implanted. In this way, an n or p region is formed in a portion of the silicon carbide substrate 10 which is disposed in the opening portion 21 of the ion implantation mask 20. Ion implantation efficiency depends on energy during ion implantation. However, when the thickness of the residual film 21a of the ion implantation mask 20 is less than 500 nm, ion implantation is performed. When the thickness of the residual film 21a is equal to or less than 200 nm, ion implantation efficiency is hardly changed. The thickness of the residual film 21a is preferably equal to or less than 100 nm.

It is difficult to form the residual film 21a with a uniform thickness on the $n^-$ silicon carbide substrate 10 due to the influence of the thickness distribution or etching rate distribution of the inorganic insulating film or the etching rate distribution of the inorganic insulating film in the opening portion 21. In this case, when the thickness of the residual film 21a is, for example, greater than 0 and less than 100 nm, no problem occurs in the ion implantation.

A manual operation and an automatic operation are considered as a method for setting the etching time of the ion implantation mask 20. When the manual operation is performed, first, the initial thickness of the ion implantation mask 20 (for example, the thickness of the ion implantation mask 20 before etching) is checked by a monitoring unit. In this case, it is assumed that the thickness is 1000 nm. Then, etching is performed for a predetermined period of time (for example, about 10 minutes) and the thickness of the residual film 21a which remains in the bottom of the opening portion 21 is checked by the monitoring unit again. It is assumed that the thickness is 400 nm. In this case, since the etching rate is 60 nm per minute, etching is performed for 5 minutes to 6.6 minutes such that the residual film 21a with a thickness that is greater than about 0 and less than about 100 nm remains in the opening portion 21.

As such, after dry etching is performed for a prescribed period of time, the thickness is checked again and the size of the residual film and the etching rate are calculated. Then, an etching time for forming a residual film with a prescribed thickness is set using the calculated values and dry etching is performed to form the ion implantation mask 20 with a prescribed shape (including the residual film 21a with a predetermined thickness).

As such, in Embodiment 1, dry etching is performed on the inorganic insulating film to form the ion implantation mask including a residual portion with a predetermined thickness in the opening portion. At that time, for example, even when dry etching is performed on an inorganic insulating film which is a laminate of films with different etching rates, the residual portion with a predetermined thickness can remain in the opening portion of the ion implantation mask. Since the ion implantation mask has a shape in which the residual portion with a predetermined thickness remains in the opening portion, the surface of the n⁻ silicon carbide substrate 10 does not suffer from physical and electrical damages due to plasma or active species generated during dry etching and can be planarized. Therefore, it is possible to suppress the occurrence of breakdown when a high voltage is applied and to manufacture a high-breakdown-voltage silicon carbide semiconductor element.

In addition, since a photoresist is not used for the ion implantation mask, the problems of the related art which have occurred when the photoresist is used for the ion implantation mask do not occur.

Figure 2:
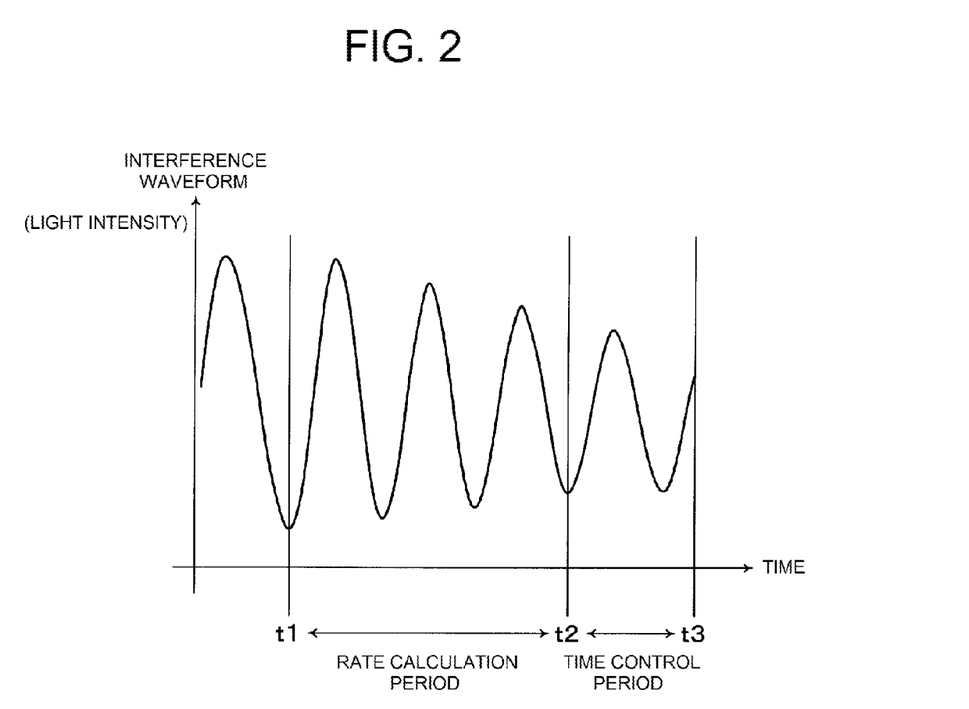
FIG. 2 is a diagram schematically illustrating the waveform of an end point monitor using a thin-film interferometer.

Next, a method for automatically setting the etching time will be described with reference to FIGS. 2 and 3. First, FIG. 2 is a diagram schematically illustrating the waveform of an end point monitor using a thin-film interferometer. The horizontal axis is time and the vertical axis is light intensity.

For example, a light emitting diode with a wavelength of 633 nm is used as a light source of the end point monitor and the intensity of incident light and reflected light is separated by an embedded beam splitter and is measured by the thin-film interferometer. At that time, light is incident on the residual film 21a of the inorganic insulating film (ion implantation mask 20) on the n⁻ silicon carbide substrate 10. The light is reflected from the upper and lower surfaces of the inorganic insulating film 20 and the reflected light components interfere with each other.

As illustrated in FIG. 2, the intensity of the interfering light is strengthened or weakened on the basis of a change in the thickness which is represented by (wavelength/2/the refractive index of the film)×an integer. Therefore, it is possible to obtain a waveform in which the intensity of reflected light is changed with the lapse of the etching time.

For example, in a case in which a $SiO_2$ film (inorganic insulating film 20) with an initial thickness of 1000 nm and a refractive index of 1.5 is etched, when the interval between adjacent peaks is 2 minutes, the etching rate is about 100 nm per minute. As such, the etching rate is calculated using a predetermined period of t1 to t2 having a predetermined number of peaks as a rate calculation period. Then, the thickness of the residual film is calculated and a time control period t3−t2 required to etch the remainder is set. At a time t3, the etching ends. In this way, it is possible to form the residual film 21a with a desired thickness in the bottom of the opening portion 21.

Figure 3:
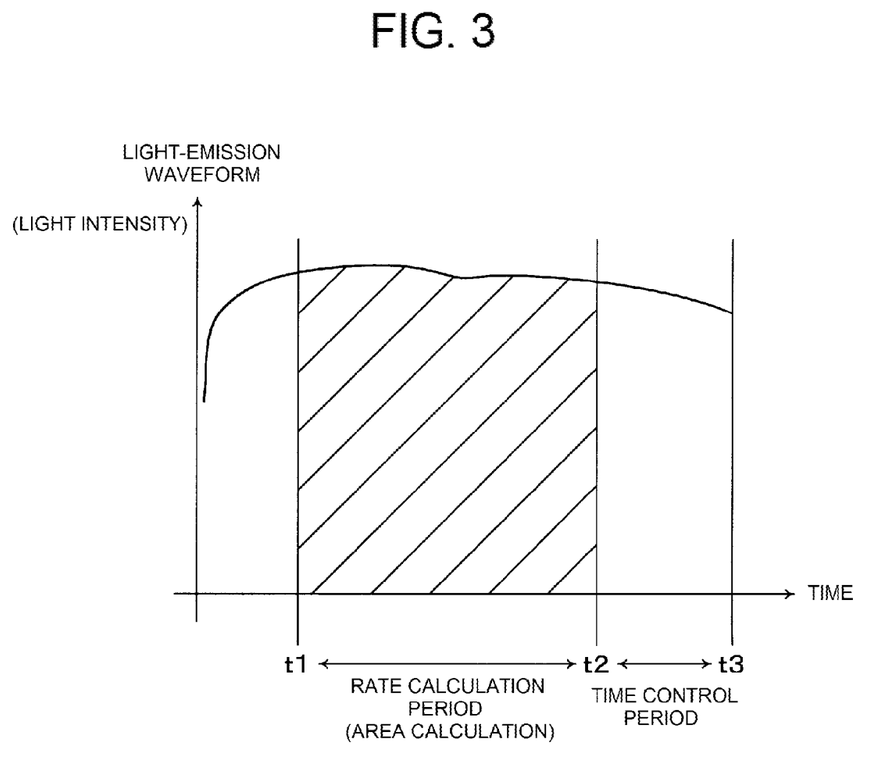
FIG. 3 is a diagram schematically illustrating the waveform of an end point monitor using an emission analysis method.

FIG. 3 is a diagram schematically illustrating the waveform of an end point monitor using an emission analysis method. The horizontal axis is time and the vertical axis is light intensity. When the $SiO_2$ film (inorganic insulating film 20) is etched by the end point monitor using the emission analysis method, emission intensity with a wavelength of about 320 nm which indicates CO bonding is observed. When the aperture ratio of the opening portion 21 is constant, the emission intensity is substantially constant for each process lot. This property is used to measure an emission intensity integral start time t1 and a time t2 until the integral value of the emission intensity becomes constant.

Then, the etching rate is corrected from the relationship between the etching rate which has been calculated in advance and the measured rate calculation period (t2−t1) and the time control period t3−t2 required to etch the remainder is set. Then, at the time t3, the etching ends. In this way, it is possible to form the residual film 21a with a desired thickness in the bottom of the opening portion 21.

Embodiment 2

Figure 4:
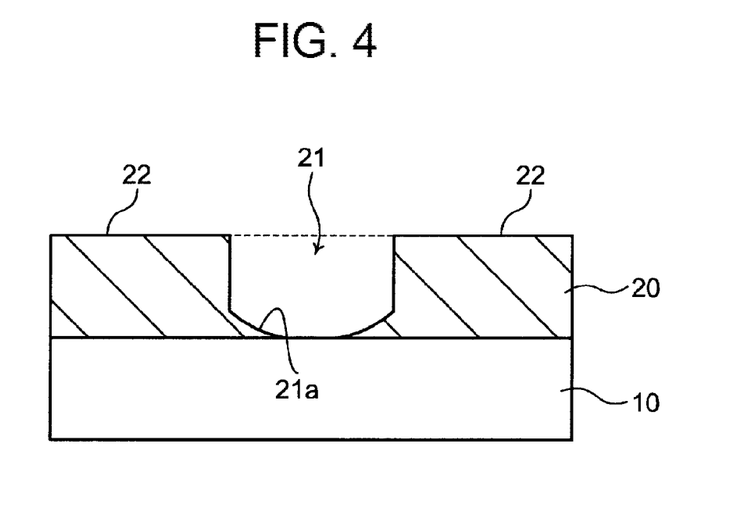
FIG. 4 is a cross-sectional view illustrating the shape of an ion implantation mask according to Embodiment 2 of the invention.

Next, a method for manufacturing a silicon carbide semiconductor element according to Embodiment 2 will be described. FIG. 4 is a cross-sectional view illustrating the shape of an ion implantation mask according to Embodiment 2 of the invention. An inorganic insulating film 20 which functions as an ion implantation mask is deposited with a thickness of 1 μm on a main surface of an n⁻ silicon carbide substrate 10, a photoresist 30 is applied onto the surface of the inorganic insulating film 20, and a resist pattern 32 is formed by the same processes as those in Embodiment 1. Then, dry etching is performed using the resist pattern 32 as a mask.

When the etching time is manually set, the initial thickness of a film, the thickness of a residual film, and the etching rate are calculated by the same method as that in Embodiment 1. When the thickness of the residual film is 400 nm and the etching rate is 60 nm per minute, etching is performed for 6.7 minutes to manufacture the ion implantation mask 20 in which a residual film 21a of the inorganic insulating film is formed in the opening portion 21.

FIG. 4 illustrates a shape in which the residual film 21a is absent at the center of the opening portion 21 of the ion implantation mask 20 (a state in which the main surface of the n⁻ silicon carbide substrate 10 is exposed through the opening portion 21). However, the invention is not limited thereto. For example, etching is performed according to etching conditions such that the residual film 21a is removed in an island shape at the end of the opening portion 21 or inside (bottom) the opening portion 21 or such that a portion of the residual film 21a remains in the opening portion 21.

Figure 5:
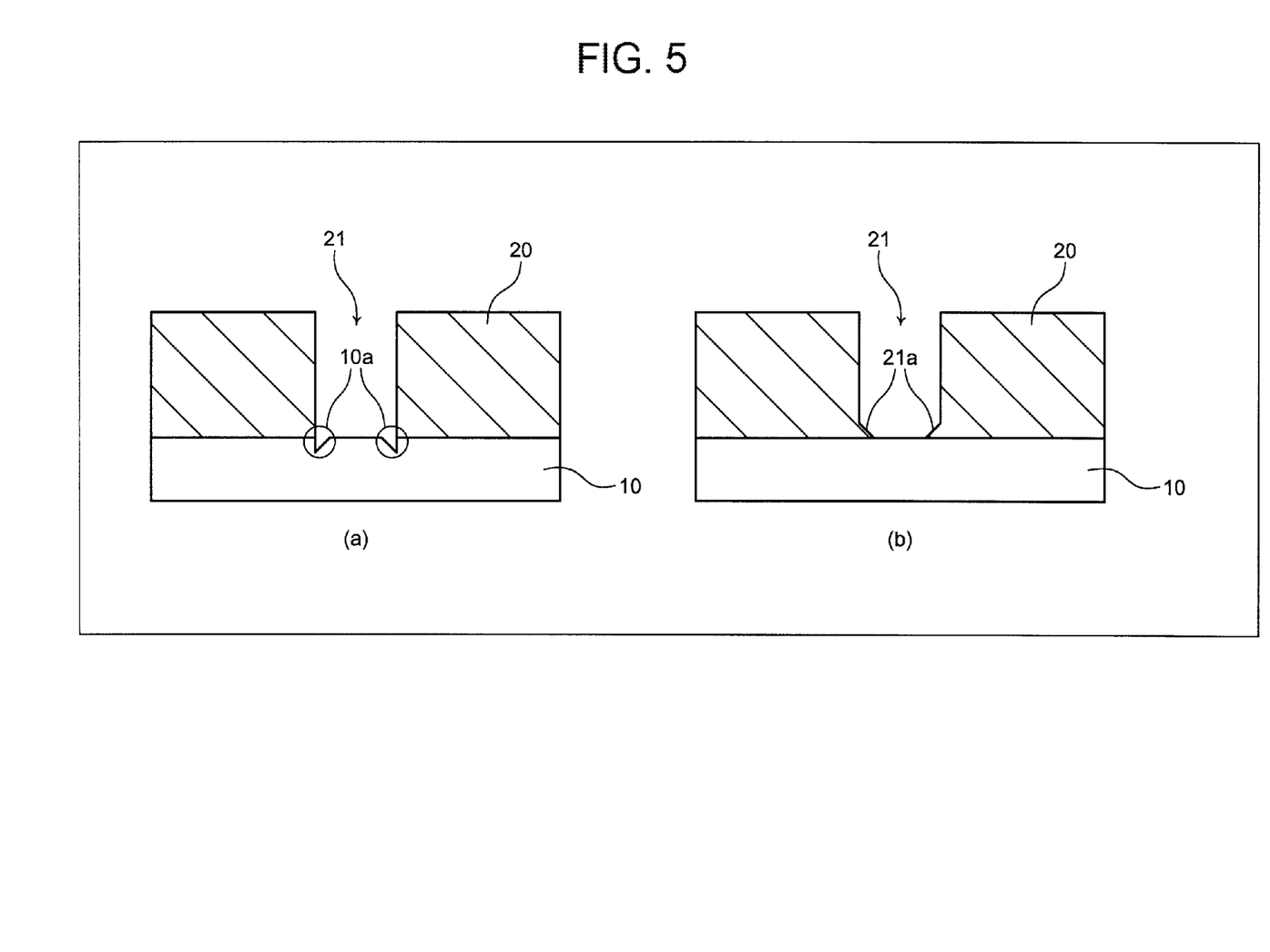
FIG. 5 is a diagram illustrating an etching state corresponding to the presence or absence of a residual film in the ion implantation mask.

FIG. 5 is a diagram illustrating an etching state corresponding to the presence or absence of the residual film in the ion implantation mask. For example, the surface of the n⁻ silicon carbide substrate 10 is exposed, considering an overetching time from the time when the opening portion 21 is expected to be formed in the ion implantation mask 20, in order to uniformly form the opening portion 21, which completely passes through the ion implantation mask 20, in the plane of a wafer using the method according to the related art. In this case, as illustrated in FIG. 5(a), dry etching gas flows along the side wall of the opening portion 21 of the ion implantation mask 20. Therefore, a portion 10a of the surface of the n⁻ silicon carbide substrate 10 which is close to the side wall of the opening portion 21 of the ion implantation mask tends to be overetched, which causes a defect in a device using the n⁻ silicon carbide substrate 10.

In contrast, as in Embodiment 2 illustrated in FIG. 5(b), when the residual portion 21a is partially formed in the opening portion 21 of the ion implantation mask 20, etching ends, with a portion, which is greatly affected by the dry etching gas, moving. As such, when the residual portion 21a is formed in a portion of the opening portion 21, the state of the surface of the n⁻ silicon carbide substrate 10 is not the best, but it is possible to prevent the surface of the n⁻ silicon carbide substrate 10 from being damaged, as compared to the method according to the related art. In Embodiment 1, the residual portion 21a is provided so as to close the opening portion 21. However, when there is a variation in thickness in the plane of the wafer, it is assumed that a part of the residual portion 21a is removed (a structure corresponding to Embodiment 2) even though etching control is performed.

When the etching time is automatically set, the etching rate is calculated by the same method as that in Embodiment 1. Then, etching is performed at the time when the etching time=the initial thickness/the etching rate is established such that the residual film 21a remains in a portion of the opening portion 21. Then, similarly to Embodiment 1, the resist pattern is removed by ashing to form the ion implantation mask.

EXAMPLE

Figure 6:
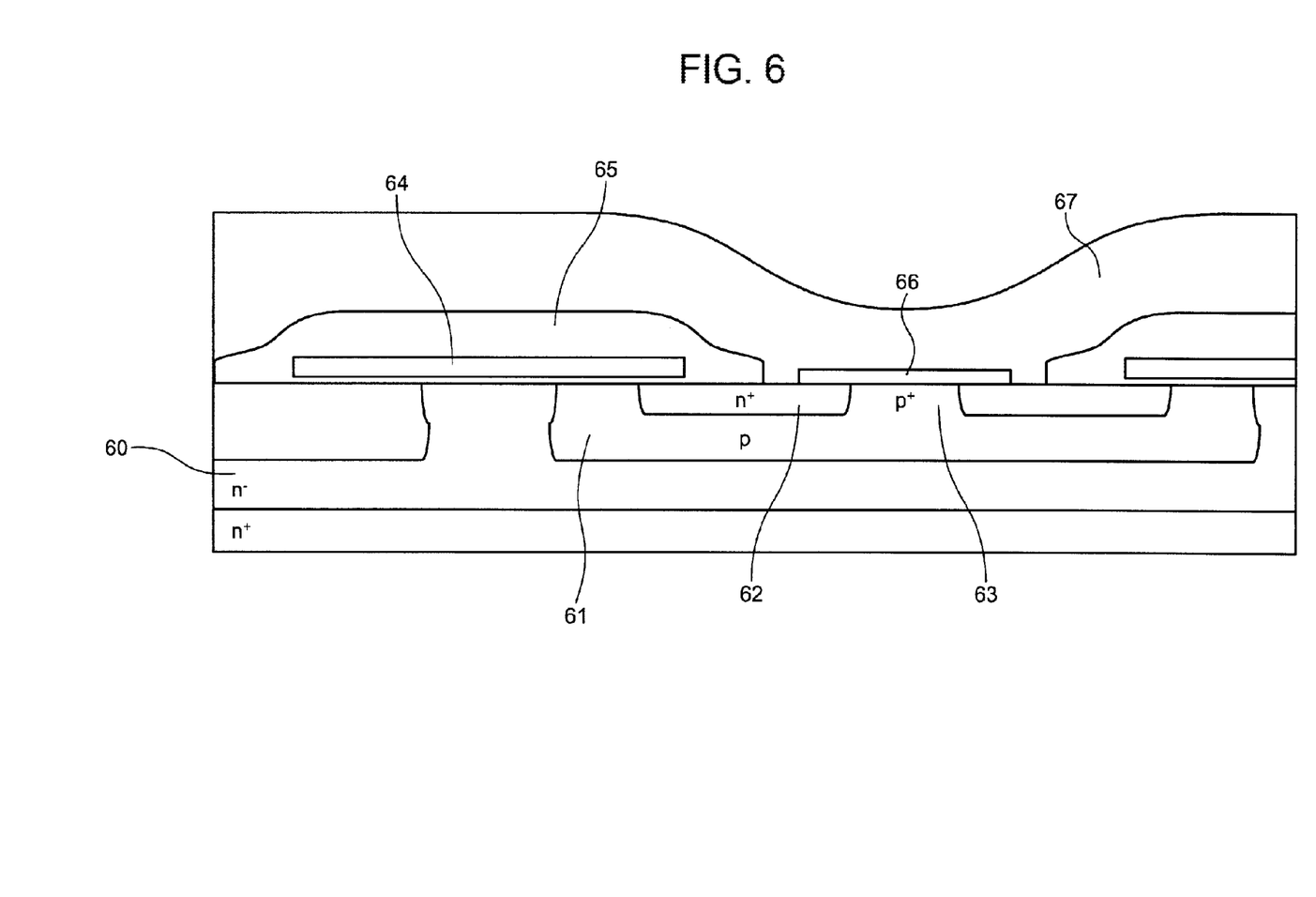
FIG. 6 is a cross-sectional view illustrating a manufactured MOSFET.

Next, the verification result of the surface shape of an opening portion 21 of a silicon carbide semiconductor element which is manufactured by the method for manufacturing the silicon carbide semiconductor element according to the embodiment of the invention will be described. FIG. 6 is a cross-sectional view illustrating a manufactured MOSFET.

First, a SiO₂ film with a thickness of 1.5 μm was formed using an atmospheric pressure CVD apparatus on an n⁻ silicon carbide substrate (the upper surface of an n⁻ silicon carbide epitaxial layer 60), which was made of four-layer periodic hexagonal silicon carbide (4H—SiC) and in which the n⁻ silicon carbide epitaxial layer 60 was formed on an n⁺ silicon carbide substrate. Then, an ion implantation mask 20 was formed on the n⁻ silicon carbide substrate according to the embodiment and Al ions were implanted through the opening portion 21 to form a p region (p base layer) 61 in a surface layer of the n⁻ silicon carbide substrate (a surface layer close to the n⁻ silicon carbide epitaxial layer 60).

Then, the ion implantation mask 20 used to form the p region 61 was removed. Then, similarly, the ion implantation mask 20 was formed on the n⁻ silicon carbide substrate according to the embodiment and phosphorus ions were implanted to selectively form an n-type source contact layer 62 in the p region 61. Then, the ion implantation mask 20 used to form the n-type source contact layer 62 was removed. Similarly, the ion implantation mask 20 was formed on the n⁻ silicon carbide substrate according to the embodiment and Al ions were implanted to selectively form a p-type source contact layer 63 in the p region 61 so as to come into contact with the n-type source contact layer 62.

Then, a p-type breakdown voltage portion (not illustrated) was formed in the outer circumference and activation annealing was performed at a temperature of about 1500° C. Then, a gate electrode 64 was formed over the surface of a portion of the p region 61 which was interposed between the n⁻ silicon carbide epitaxial layer 60 and the n-type source contact layer 62, with a gate oxide film interposed therebetween, and an interlayer insulating film 65 was formed so as to cover the gate electrode 64. Then, a contact hole was formed in the interlayer insulating film 65 and a source contact electrode 66 was formed so as to come into contact with the n-type source contact layer 62 and the p-type source contact layer 63. Then, an electrode pad 67 was formed so as to come into contact with the source contact electrode 66. In this way, the MOSFET illustrated in FIG. 6 was manufactured (an element according to the example). As a comparative example, a MOSFET was manufactured using an ion implantation mask (inorganic insulating film) 20 in which a residual film 21a formed in the bottom of an opening portion 21 was sufficiently removed (conventional example).

As a result, in the conventional example, a level difference of about 5 nm occurred at the end of the n-type source contact layer 62 subjected to ion implantation. However, in the element according to the example, the entire surface of the n-type source contact layer 62 was flat in correspondence with the opening portion 21. As such, it was possible to planarize the n-type source contact layer 62, as compared to the conventional example. In the element according to the example, the breakdown voltage could be significantly improved from about 480 V, which was obtained in the conventional example, to 720 V. In addition, in the MOSFET which was manufactured using the ion implantation mask 20 according to Embodiment 2, it was confirmed that the same effect as that in the example could be obtained.

The invention is not limited to the above-described embodiments and various modifications and changes of the invention can be made without departing from the scope and spirit of the invention. For example, in the invention, the p type and the n type may be reversed or the silicon carbide substrate and the epitaxial layer which is grown on the main surface of the silicon carbide substrate may have the same conductivity type. In this case, it is possible to manufacture the same semiconductor element and the same effect as described above is obtained.

INDUSTRIAL APPLICABILITY

As described above, the method for manufacturing the silicon carbide semiconductor element according to the invention is useful for a silicon carbide semiconductor element using silicon carbide as a semiconductor material. In particular, the method for manufacturing the silicon carbide semiconductor element according to the invention is suitable for a vertical power device semiconductor element in which a current flows from the front surface to the rear surface of a semiconductor substrate and is useful for, for example, a power semiconductor device of a power device or a power semiconductor device used to control an industrial motor or an engine.

EXPLANATIONS OF LETTERS OR NUMERALS

10 SILICON CARBIDE SUBSTRATE (n⁻ SILICON CARBIDE SUBSTRATE)

20 ION IMPLANTATION MASK
21 ION IMPLANTATION PORTION
21a RESIDUAL PORTION
22 MASK PORTION
60 n⁻ SILICON CARBIDE EPITAXIAL LAYER
61 p BASE LAYER
62 n-TYPE SOURCE CONTACT LAYER
63 p-TYPE SOURCE CONTACT LAYER
64 GATE ELECTRODE
65 INTERLAYER INSULATING FILM
66 SOURCE CONTACT ELECTRODE
67 ELECTRODE PAD

What is claimed is:

1. A method for manufacturing a silicon carbide semiconductor element comprising the steps of:
    providing a single-crystal silicon carbide substrate;
    forming on the silicon carbide substrate an ion implantation mask that is an inorganic insulating film comprised of any one of a silicon oxide, a silicon oxynitride, and a silicon nitride;
    dry etching the ion implantation mask to form:
        a mask portion;
        an opened ion implantation portion having a bottom; and
        a residual portion provided in the bottom of the opened ion implantation portion and having a thickness that is less than that of the mask portion;
    implanting ions through the ion implantation mask to form a predetermined semiconductor region in the silicon carbide substrate; and
    calculating, prior to dry etching to form the ion implantation portion, an etching rate required to form the ion implantation portion and to form a predetermined size of a residual film, and an etching time required to form the residual portion having a predetermined thickness, on the basis of a relationship between the calculated etching rate and the calculated size of the residual film; and
    performing dry etching for the calculated etching time.

2. The method for manufacturing a silicon carbide semiconductor element according to claim 1, wherein the residual portion has a thickness of 100 nm or less.

* * * * *